US006793792B2

(12) United States Patent
Jones et al.

(10) Patent No.: US 6,793,792 B2
(45) Date of Patent: Sep. 21, 2004

(54) ELECTROPLATING METHODS INCLUDING MAINTAINING A DETERMINED ELECTROPLATING VOLTAGE AND RELATED SYSTEMS

(75) Inventors: Curtis Grant Jones, Raleigh, NC (US); William Boyd Rogers, Raleigh, NC (US); Glenn A. Rinne, Apex, NC (US)

(73) Assignee: Unitive International Limited Curaco, Netherland Antilles (NL)

( * ) Notice: Subject to any disclaimer, the term of this patent is extended or adjusted under 35 U.S.C. 154(b) by 478 days.

(21) Appl. No.: 10/044,387

(22) Filed: Jan. 11, 2002

(65) Prior Publication Data

US 2002/0092771 A1 Jul. 18, 2002

Related U.S. Application Data

(60) Provisional application No. 60/261,704, filed on Jan. 12, 2001.

(51) Int. Cl.[7] .............................. C25D 5/00; C25D 21/12
(52) U.S. Cl. ........................ 205/83; 204/228.1; 205/106
(58) Field of Search ........................... 205/81, 83, 106; 204/228.1, 229.8, 230.2

(56) References Cited

U.S. PATENT DOCUMENTS 5,293,006 A    3/1994   Yung
6,117,299 A    9/2000   Rinne et al.
6,231,743 B1 *  5/2001  Etherington ................... 205/83
6,440,291 B1 *  8/2002  Henri et al. .................. 205/205
6,495,018 B1 * 12/2002  Lowe .............................. 205/83

OTHER PUBLICATIONS

Solomon "*Providing High Density and Performance for Chip–to System Interconnection*" Advanced Packaging (Nov. 2001) pp 19–28.

Yung et al; "*Flip–Chip Process Utilizing Electroplated Solder Joints*"; Proceedings of the Technical Conference, (Sep. 10–12, 1990) International Electronics Packaging Conference Malborough, Massachusetts pp1065–1073.

* cited by examiner

*Primary Examiner*—Roy King
*Assistant Examiner*—William T. Leader
(74) *Attorney, Agent, or Firm*—Myers Bigel Sibley & Sajovec

(57) ABSTRACT

Methods for electroplating metal can include passing an electrical current through a conductive surface and an electroplating solution adjacent the conductive surface. An electroplating voltage for the conductive surface and the electroplating solution can be determined based on the electrical current through the conductive surface and the electroplating solution adjacent the conductive surface. The determined electroplating voltage can then be maintained while electroplating the metal from the electroplating solution on the conductive surface. Related systems are also discussed.

36 Claims, 6 Drawing Sheets

ELECTROPLATING METHODS INCLUDING MAINTAINING A DETERMINED ELECTROPLATING VOLTAGE AND RELATED SYSTEMS

RELATED APPLICATIONS

The present application claims priority from U.S. Provisional Application No. 60/261,704 entitled "Electroplating Using Voltage Control And/Or Integrated Charge" filed Jan. 12, 2001. The disclosure of U.S. Provisional Application No. 60/261,704 is hereby incorporated herein in its entirety by reference.

BACKGROUND

The present application relates to the field of metal deposition and more particularly to methods and systems for electroplating metal.

Metal layers can be formed by electroplating metal on a conductive surface. For example, solder bumps for microelectronic devices can be electroplated on contact pads, and the electroplated solder bumps can be used to provide electrical and/or mechanical interconnection to a next level of packaging such as another microelectronic device and/or a printed circuit board. More particularly, a continuous underbump metallurgy layer can be provided on a microelectronic substrate (such as a wafer including a plurality of microelectronic devices), and a plating mask (such as can be provided using photolithographic techniques) can be used to expose portions of the underbump metallurgy layer on which solder bumps are to be grown. Electroplating is discussed, for example, in U.S. Pat. No. 6,117,299 entitled "Methods Of Electroplating Solder Bumps Of Uniform Height On Integrated Circuit Substrates" and in U.S. Pat. No. 5,293,006 entitled "Solder Bump Including Circular Lip". Each of these patents is assigned to the assignee of the present invention, and the disclosures of each of these patents are hereby incorporated herein in their entirety by reference.

An electrode can be coupled to the continuous underbump metallurgy layer, a plating solution including the metal(s) to be electroplated can be provided, and an anode can be provided. By providing a plating current through the anode, plating solution, exposed portions of the underbump metallurgy layer, and the electrode, layers of the metal can be formed on exposed portions of the underbump metallurgy layer. The volume of the metal plated can be approximately proportional to the total charge of the plating current. Current control has thus been used in electroplating to provide deposition of a relatively uniform volume of metal. With current control, a fixed current can be applied to the plating solution over a fixed interval of time to provide a relatively uniform volume of plated solder.

SUMMARY OF THE INVENTION

According to embodiments of the present invention, methods for electroplating metal can include passing an electrical current through a conductive surface and an electroplating solution adjacent the conductive surface. An electroplating voltage can be determined based on the electrical current through the conductive surface and the electroplating solution adjacent the conductive surface. The determined electroplating voltage can then be maintained while electroplating the metal from the electroplating solution on the conductive surface. By using an electrical current through the conductive surface and electroplating solution to determine an electroplating voltage, a more uniform electroplating rate (growth in thickness per unit time) may be provided. In addition, a more uniform plated metal may be provided.

A seed layer on a substrate can be covered with a plating mask that exposes portions of the seed layer on which solder bumps are to be plated. Sidewalls of the plating mask may have a slope so that a surface area of the bumps being plated increases as the thickness of the bumps increases. In addition, surface areas of the bumps may increase even more rapidly as the bumps "mushroom" outside the plating mask (i.e. grow over a top surface of the plating mask). By applying a fixed current during plating, the plating rate (growth in thickness per unit of time) may decrease as the exposed plating area increases. In sharp contrast, some embodiments of the invention may provide a constant plating rate which may provide a greater uniformity of the deposited metal layer.

DETAILED DESCRIPTION

Figure 1A:
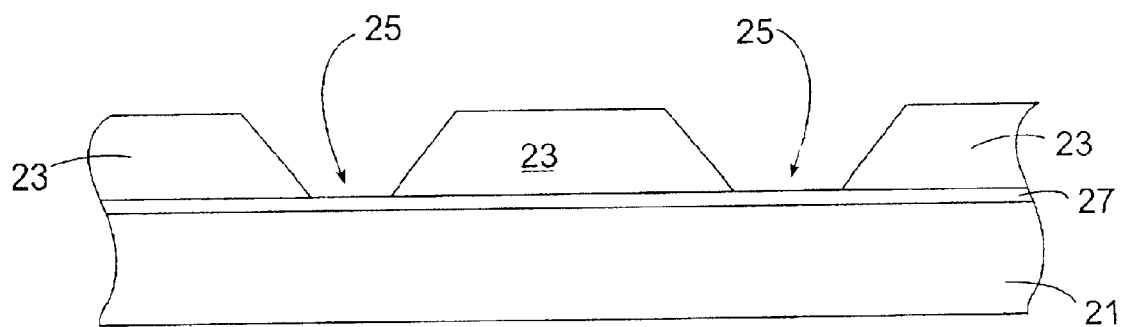
FIGS. 1A–B are cross-sectional views illustrating steps of electroplating metal layers according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness and/or dimensions of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Also, when an element is referred to as being "bonded" to another element, it can be directly bonded to the other element or intervening elements may be present. In contrast, when an element is referred to as being "directly bonded" to another element, there are no intervening elements present.

As shown in FIG. 1A, a substrate 21 can be provided with a seed layer 27, such as an underbump metallurgy layer, thereon, and a plating mask 23 can be provided on the seed layer 27 wherein the plating mask 23 exposes portions 25 of the seed layer 27 on which metal is to be deposited. For example, the substrate 21 can be a microelectronic substrate including a plurality of electronic devices (such as resistors, capacitors, inductors, and/or transistors) integrated therein. More particularly, the substrate 21 can be a production wafer including a plurality of integrated circuit devices thereon, wherein the integrated circuit devices can be cut apart after production thereof. The seed layer 27 can be continuous across substrate 21 (such as a production wafer) to allow electrical coupling of all exposed portions 25 of the seed layer 27 with a plating electrode. Alternatively, a continuous seed layer may not be required, for example, if a plating current is applied through a backside of the substrate. Other conventional plating bases may also be used.

Layers of metal can be electroplated on the exposed portions 25 of the seed layer 27 by providing an electroplating solution adjacent exposed portions 25 of the seed layer 27 and providing a plating current through the plating solution and the seed layer 27. More particularly, an anode can be placed in contact with the plating solution and a plating electrode can be electrically coupled with the seed layer 27 so that the plating current can be passed through the anode, the plating solution, the exposed portions 25 of the seed layer 27, and the plating electrode. The resulting plated metal layers 29 are shown in FIG. 1B.

Figure 1B:
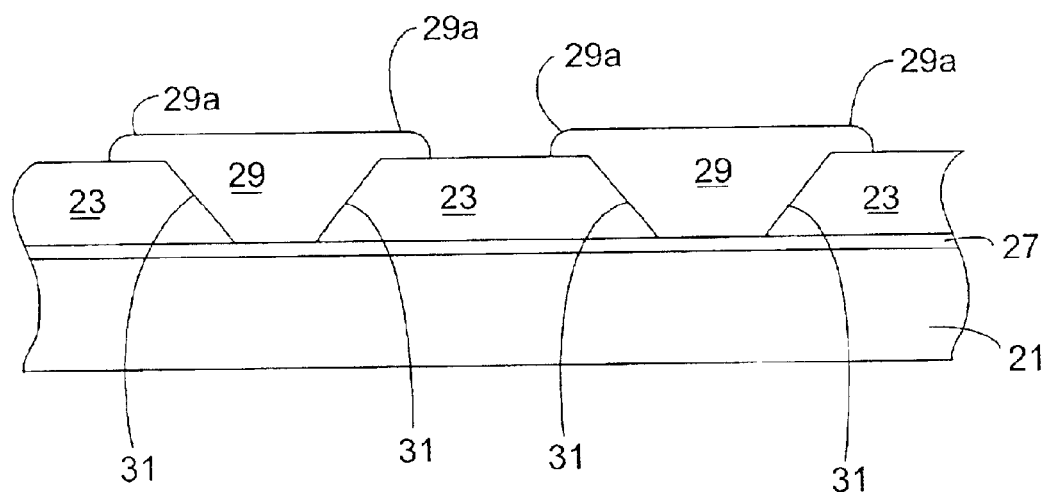

As shown in FIG. 1B, the plating mask 23 may have sloped sidewalls 31 so that widths (and exposed surface areas) of the resulting plated metal layers 29 increase with increasing metal thickness. Even if the plating mask sidewalls are vertical, a profile of the plated metal layer 29 may not be uniform if the metal is plated over the surface of the plating mask 23 opposite the substrate 21. Plating over a surface of the plating mask 23 is also referred to as "mushrooming", and mushroom portions of the metal layers are designated with reference number 29a. According to some embodiments illustrated in FIG. 1B, an exposed surface area of metal layers 29 may increase at a first rate due to the sloped sidewalls 31 of the plating mask 23 and at a second rate due to mushrooming.

If a continuous plating current is used to form the metal layers 29, a deposition rate of the metal layers may decrease as an exposed surface area of the metal layers increases. According to some embodiments of the present invention, a constant plating voltage can be applied during electroplating so that a relatively uniform plating rate (increase in thickness per unit time) can be maintained despite increasing plating surface area over time. In other words, a uniform plating rate may be provided as a plating surface area increases or decreases. An increase in uniformity of the plated metal may thus be provided.

More particularly, methods and systems according to some embodiments of the present invention can include generating an initial plating current through the conductive surface, and determining a plating voltage resulting at the initial plating current. The determined plating voltage can then be maintained while electroplating the metal on the conductive surface to provide a variable plating current while electroplating the metal on the conductive surface. More particularly, the initial plating current can be selected to provide an initial plating rate based on a combined surface area of the exposed portions 25 of the seed layer 27.

The voltage resulting at the initial plating current can thus be maintained during electroplating so that a relatively uniform plating rate can be maintained as an exposed surface area of the plated metal layers increases thereby increasing the plating area. Accordingly, a constant plating voltage can result in a plating current that increases as an exposed surface area of the plated metal layers increases and/or that decreases as an exposed surface area of the plated metal layers decreases. In other words, a relatively uniform current density per unit plating area can be maintained across an exposed surface area of the plated metal layers even as a surface area of the plated metal layers changes during an electroplating operation. A relatively uniform current density per unit plating area may provide a more uniform electroplated metal layer and a more uniform deposition rate.

According to some embodiments of the present invention, a uniform current density can be provided across an exposed surface area of a metal layer being plated to provide a uniform plating rate defined in terms of uniform growth in thickness per unit time. Accordingly, the plating current may increase as the exposed surface area of the metal layer increases, and a rate of plated metal volume may increase even though the plating rate defined in terms of uniform growth in metal thickness per unit time remains relatively constant.

Figure 2:
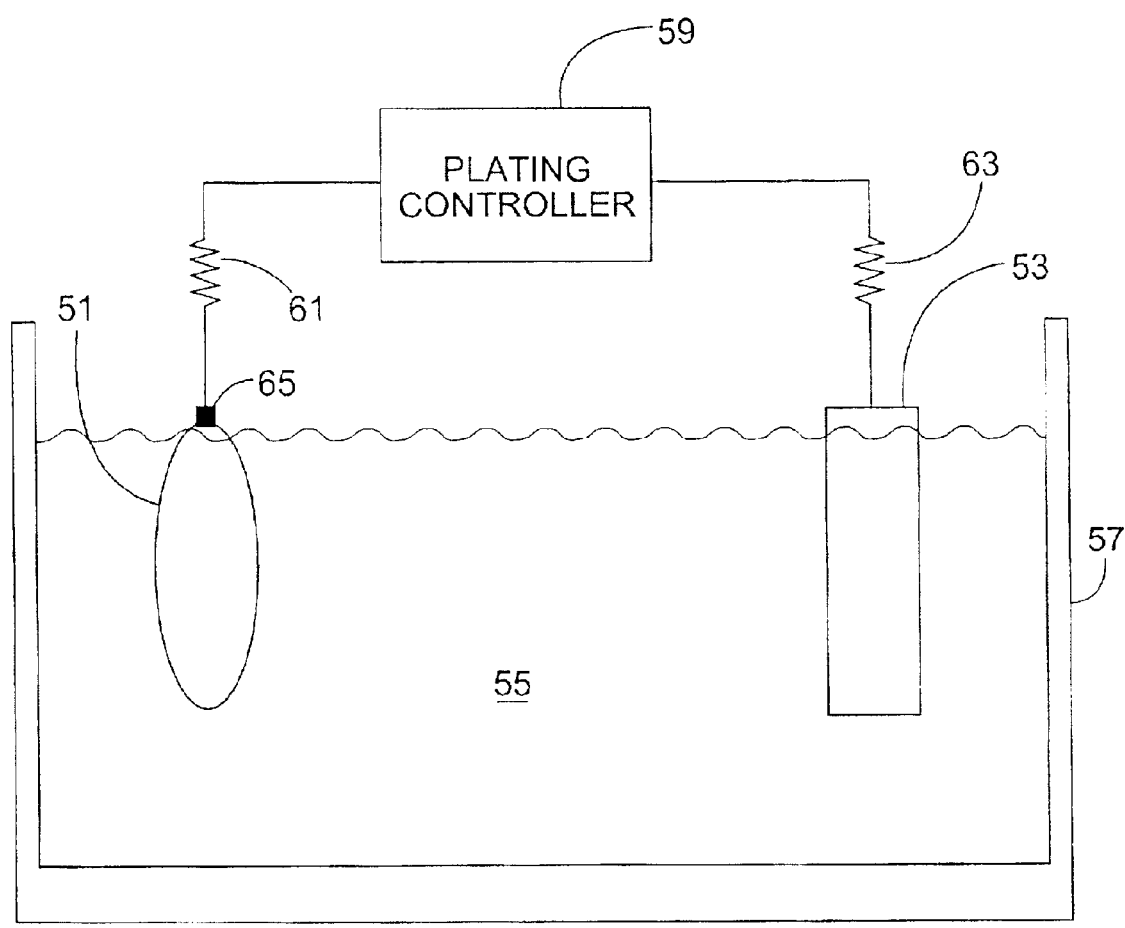
FIG. 2 illustrates an electroplating system according to embodiments of the present invention.

A system for electroplating metal layers according to some embodiments of the present invention is illustrated in FIG. 2. As shown, a substrate 51 and an anode 53 can be placed in a plating solution 55 contained within a plating tank 57. The plating controller 59 can provide plating voltages and/or currents through the anode 53, the plating solution 55, and the substrate 51 to provide plated metal layers on the substrate 51. Resistances 61 and 63 model resistances that may be included (intentionally and/or unintentionally) in the plating circuit.

The substrate 51 may be a production wafer including a plurality of integrated circuit devices thereon with each integrated circuit device including one or more exposed portions of an seed layer for electroplating metal thereon. The substrate 51, for example, may have a similar cross sectional structure as that illustrated in FIG. 1A with many exposed portions of the seed layer for electroplating many different metal layers. In addition, the substrate 51 may include an exposed portion of the seed layer at an edge thereof to allow electrical coupling with the plating electrode 65. Moreover, an edge portion of the seed layer may be exposed around an entire perimeter of the substrate 51 to provide a lower resistance coupling with the plating electrode 65 and to provide a more uniform current distribution through each of the exposed portions of the seed layer. Wafer edge contact is discussed, for example, by G. Solomon in "Process Integration Of Electroplated Solder Bumps For WLP" (Advanced Packaging, November 2001, pp. 19–28). The disclosure of the Solomon reference is hereby incorporated herein in its entirety by reference.

The plating controller 59 provides the electrical power used to generate the plating current through the anode 53, the plating solution 55, the substrate 51, and the plating electrode 65. More particularly, the plating controller can generate an initial plating current through the anode, plating solution, and substrate 51, wherein the initial plating current is selected to provide a desirable plating rate based on a surface area of the exposed portions of the seed layer. The plating controller 59 can then determine the plating voltage resulting at the initial plating current, and the determined plating voltage can be maintained while electroplating metal on the conductive surface to provide a variable plating current while electroplating the metal.

The plating voltage, for example, can be measured and/or maintained at the outputs of the plating controller 59; at the resistances 61 and 63; at the plating electrode 65 and the anode 53; at other points in the electroplating circuit; and/or at combinations thereof. In some embodiments, because the resistances in the plating circuit may be relatively constant once a given substrate 51 is secured to a given plating electrode 65 in a given electroplating solution 55 with a given anode 53 and with a given plating controller 59 and given resistances 61 and 63, the electroplating voltage can be determined and maintained using voltage measurements at any two points in the electroplating circuit as long as the same two points are used to determine and maintain the electroplating voltage. While resistances 61 and 63 are shown for the purposes of illustration, portions or all of these resistances may be included within the plating controller, the plating electrode, the anode, the plating solution, and/or couplings therebetween.

In addition, a plating current can be integrated while electroplating the metal to determine a cumulative plating charge, and the electroplating operation can be ceased when the cumulative plating charge reaches a predetermined threshold. Accordingly, a predetermined volume of metal can be deposited on the exposed portions of the seed layer of the substrate 51 while providing a relatively uniform plating rate of the metal layers, and while maintaining a relatively uniform density of plating current across exposed surfaces of the metal layers being plated.

The initial plating current, for example, can be calculated based on a total exposed surface area of the seed layer, a desired plating rate, and/or a composition of the plating solution 55. The initial plating current can then be generated by stepping a plating voltage until the previously calculated initial plating current is achieved. Alternatively, the initial plating current can be determined by estimating a voltage-current function using currents through the substrate and estimating an inflection point in the voltage-current function. The plating voltage can then be determined based on the inflection point in the voltage-current function.

Figure 3:
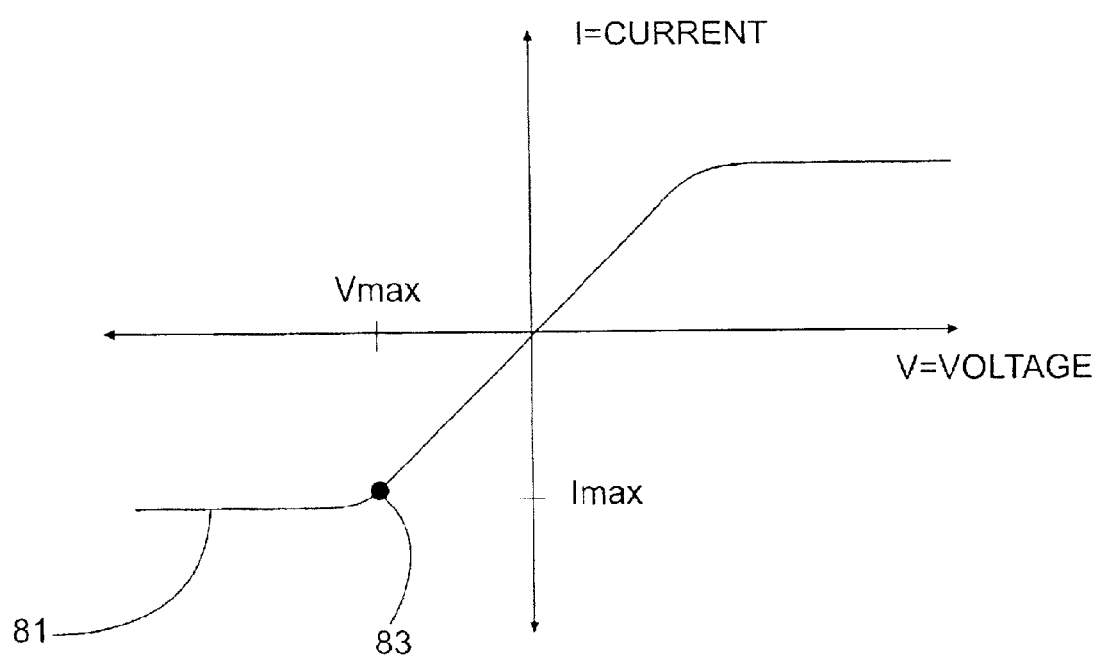
FIG. 3 is a graph illustrating a voltage-current function according to embodiments of the present invention.

A voltage-current (V-I) function 81 according to some embodiments of the present invention is illustrated in FIG. 3. The V-I function 81, for example, can plot plating/deplating currents I through the anode 53, the plating solution 55, the substrate 51, and the plating electrode 65 as a function of plating voltages V measured at the plating controller 59 to provide a curve. As shown, negative plating voltages and currents provide metal plating on the substrate 51, and the V-I function 81 can be relatively linear from the origin of the function to the inflection point 83 with coordinates Vmax, Imax. Accordingly, increased plating voltages can provide approximately proportional increased plating currents and increased plating rates until the inflection point 83 is reached at Vmax, Imax. Beyond the inflection point, increased plating voltages may not result in significantly increased plating currents or plating rates as indicated by the relatively horizontal portion of the V-I function 81, and in fact, a reduced quality of plated metal may result with voltages greater than Vmax.

The plating controller 59 can thus generate a plurality of plating voltages and plating currents using a substrate 51 to be plated in the plating system to estimate a V-I function (such as the V-I curve illustrated in FIG. 3). The data for the V-I function can then be used to determine the inflection point 83 at Vmax, Imax. A voltage of Vmax (or less) can then be used as a constant plating voltage during electroplating.

The resulting V-I curve of FIG. 3 can be a function of the resistances throughout the plating circuit illustrated in FIG. 2, including resistances 61 and 63; a resistance of the plating solution 55; a resistance of the substrate 51, the plating electrode 65, and a coupling therebetween; and resistances between the plating solution 55 and the anode 53 and between the plating solution 55 and the substrate. For example, resistances between different substrates and the plating electrode 65 may vary due to differences in mechanical coupling therebetween; resistances between a substrate 51 and a plating solution 55 may vary due to process variations in forming a plating mask resulting in differences in exposed surface area of an seed layer; and/or resistances may vary due to differences in composition of the plating solution 55.

Because these resistances may vary from substrate to substrate and/or from system to system, an estimation of an inflection point 83 for each substrate being plated may provide a more accurate plating voltage for substrates 51. Moreover, the current Imax may be used to provide a relatively accurate estimation of the surface area of seed layer exposed by the plating mask. More particularly, Imax may be approximately equal to a product of a maximum plating density Jmax of the plating solution and an exposed surface area of an seed layer. Because the maximum plating density of a plating solution can be known, an exposed surface area of seed can be-calculated using Imax/Jmax.

The use of a V-I function as illustrated in FIG. 3 can thus be used to determine a maximum plating voltage suitable for plating a particular substrate. Subsequent plating of the substrate can be performed at a constant plating voltage having an absolute value of Vmax or less. Because operations of estimating a V-I function for a substrate may result in plating of some metal at a plating voltage beyond Vmax, a deplating operation may be performed to deplate metal plated during generation of a V-I function, so that plating at a plating voltage of Vmax or less may begin on the seed layer. In other words, metal plated at a voltage beyond Vmax may have a relatively low quality, and any relatively low quality metal may be deplated (removed) before actual plating operations. More particularly, deplating can be performed by applying a deplating voltage having a polarity opposite that of the plating voltage.

While a V-I curve is illustrated in FIG. 3 by way of example, an inflection point and a maximum plating voltage Vmax can be estimated or calculated without actually generating a graphic curve. A plurality of plating voltages and corresponding currents can be measured by the plating controller 59 and used to estimate an inflection point and/or maximum plating voltage without human intervention. Alternatively, a curve tracer can be provided as a part of or separate from the plating controller, a graphical output of the curve tracer can be used by a human operator to estimate an inflection point (i.e. a maximum plating voltage), and the desired plating voltage can be entered by the human operator.

Electroplating systems according to some embodiments of the present invention can provide electroplating of multiple substrates in parallel or series. An electroplating system according to some embodiments of the present invention, for example, can include multiple plating electrodes coupled to the plating controller with each plating electrode being coupled to a different substrate to be electroplated. Moreover, each plating electrode may be associated with a respective manipulator so that each substrate coupled to each plating electrode can be sequentially electroplated in the same electroplating solution using the same anode. By determining an electroplating voltage for each substrate based on a current through the electroplating solution and the respective substrate, a desired plating rate can be provided for each substrate despite, for example, differences in resistances through plating electrodes, differences in coupling resistances between the plating electrodes and respective substrates, differences in plating solution chemistry from run to run, and/or differences in the anode from run to run. The same principles can be used to provide uniform plating on substrates that are plated in the same plating solution at the same time.

Figure 4:
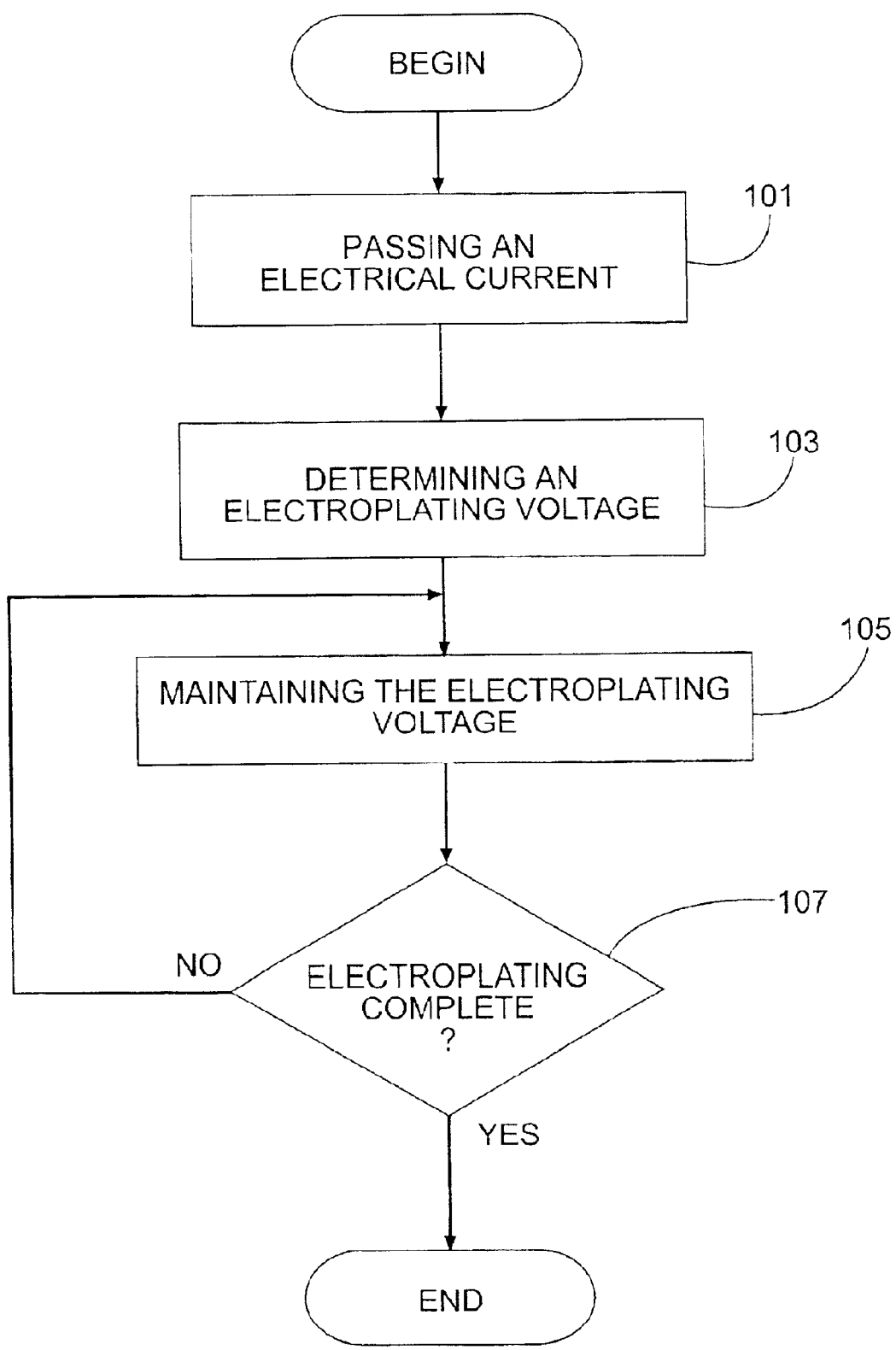
FIGS. 4–6 are flow charts illustrating operations according to the present invention.

Operations for electroplating metal on a conductive surface according to some embodiments of the present invention are illustrated, for example, in FIG. 4. An electrical current can be passed through an electroplating solution and a conductive surface to be electroplated at block 101, and an electroplating voltage can be determined based on the electrical current through the conductive surface and the electroplating solution at block 103. The determined electroplating voltage can be maintained while electroplating the metal from the electroplating solution on the conductive surface to provide a variable electroplating current while electroplating the metal from the electroplating solution on the conductive surface at block 105. The determined electroplating voltage can be maintained at block 105 until electroplating is complete at block 107.

Completion of electroplating may be determined at block 107 by integrating the electroplating current while electroplating the metal from the electroplating solution on the conductive surface to determine a total electroplating charge. In the alternative, a set time period of electroplating may be desired at the determined electroplating voltage. In addition, electroplating may continue once electroplating at the determined voltage is complete. For example, it may be desirable to continue electroplating at a different and/or variable voltage and/or at a constant current after electroplating at the determined voltage.

According to some embodiments illustrated in FIG. 4, the conductive surface may include an seed layer on a microelectronic substrate and an electroplating mask on the seed layer. More particularly, the electroplating mask may expose portions of the seed layer for electroplating. By maintaining a determined electroplating voltage while electroplating, a relatively constant electroplating rate (increase in thickness/time) may be provided even though a plating surface area may increase with increasing thickness as a result of sloped sidewalls of the electroplating mask and/or mushrooming on the electroplating mask.

Figure 5:
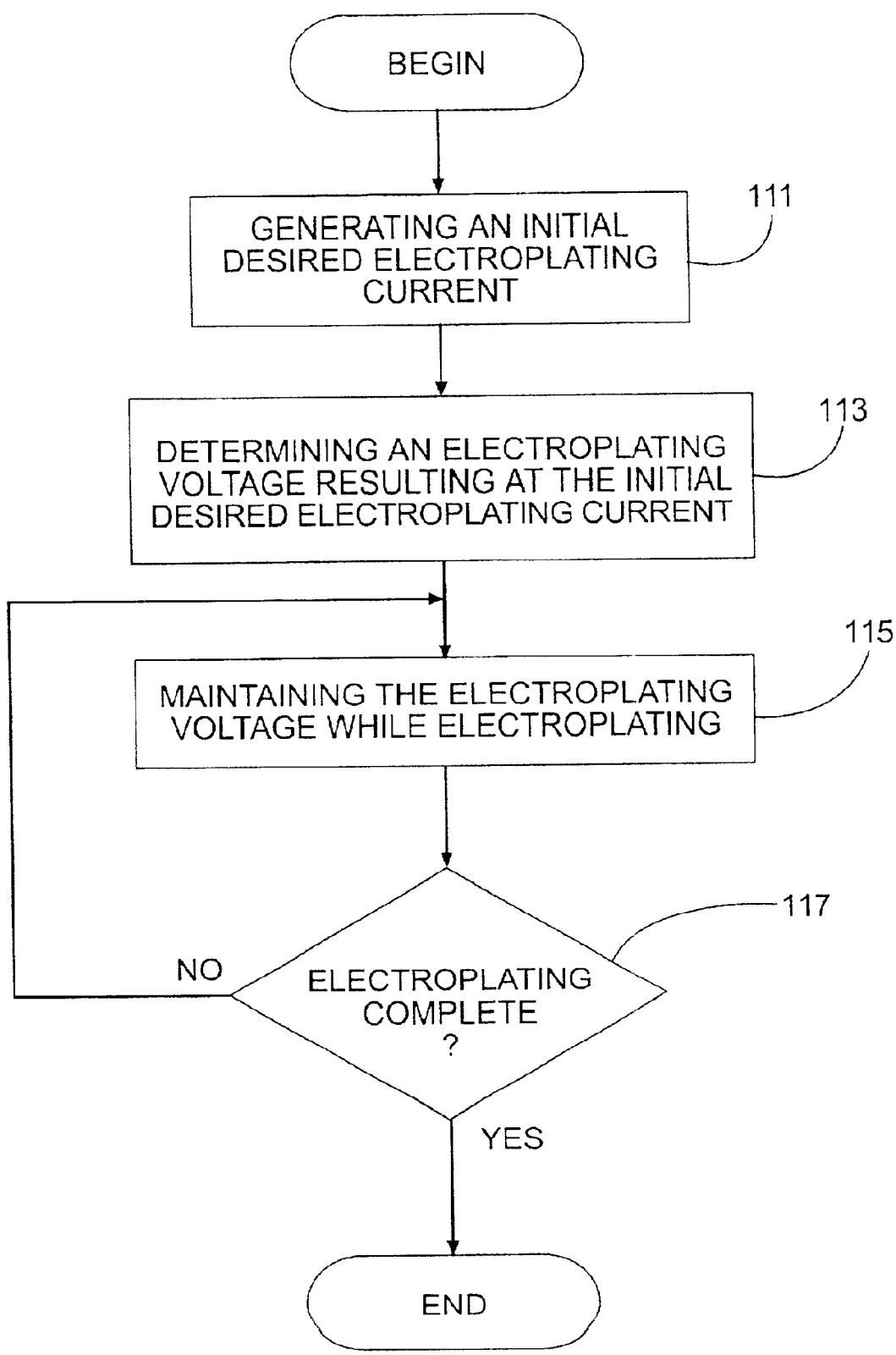

Operations for electroplating metal according to alternative embodiments according to the present invention are illustrated in FIG. 5. In FIG. 5, an initial desired electroplating current can be generated through the conductive surface and the electroplating solution at block 111, and an electroplating voltage determined as the electroplating voltage resulting at the initial desired electroplating current at block 113. The determined electroplating voltage can be maintained while electroplating metal from the electroplating solution on the conductive surface to provide a variable electroplating current while electroplating the metal from the electroplating solution on the conductive surface at block 115.

Completion of electroplating may be determined at block 117 by integrating the electroplating current while electroplating the metal from the electroplating solution on the conductive surface to determine a total electroplating charge. In the alternative, a set time period of electroplating may be desired at the determined electroplating voltage. In addition, electroplating may continue once electroplating at the determined voltage is complete. For example, it may be desirable to continue electroplating at a different and/or variable voltage and/or at a constant current after electroplating at the determined voltage.

According to some embodiments illustrated in FIG. 5, generating the initial desired electroplating current can include varying an applied voltage until a desired initial electroplating current is achieved. Moreover, the desired initial electroplating current may be selected to provide a predetermined electroplating rate on an initial electroplating surface area.

Figure 6:
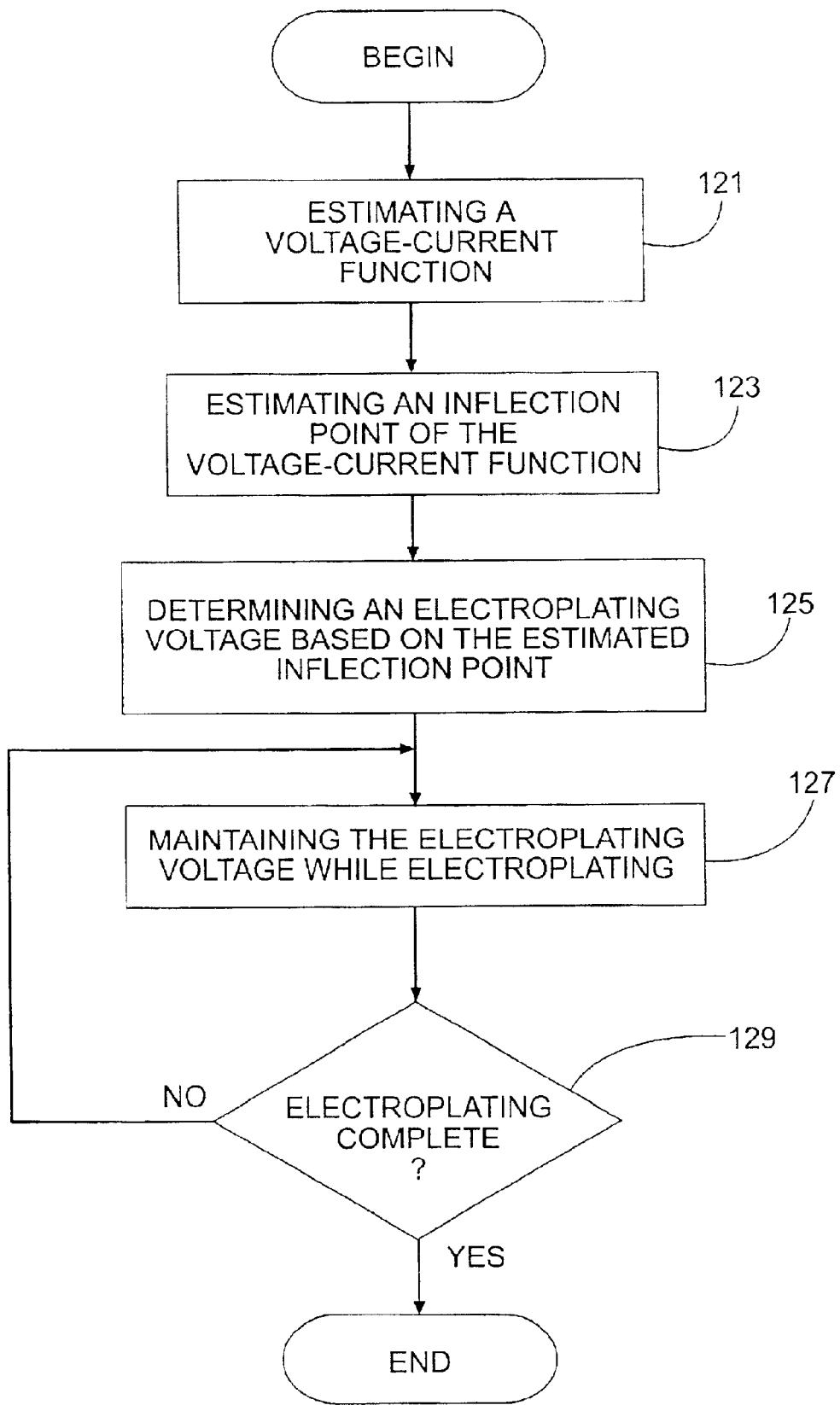

Operations for electroplating metal according to yet additional embodiments according to the present invention are illustrated in FIG. 6. In FIG. 6, a voltage-current function can be estimated using currents through the conductive and electroplating solution at block 121, and an inflection point in the voltage-current function can be estimated at block 123. An electroplating voltage can be determined based on the estimated inflection point of the voltage-current function at block 125, and the determined electroplating voltage can be maintained while electroplating metal from the electroplating solution on the conductive surface to provide a variable electroplating current while electroplating the metal from the electroplating solution on the conductive surface at block 125.

Completion of electroplating may be determined at block 127 by integrating the electroplating current while electroplating the metal from the electroplating solution on the conductive surface to determine a total electroplating charge. In the alternative, a set time period of electroplating may be desired at the determined electroplating voltage. In addition, electroplating may continue once electroplating at the determined voltage is complete. For example, it may be desirable to continue electroplating at a different and/or variable voltage and/or at a constant current after electroplating at the determined voltage.

According to some embodiments illustrated in FIG. 6, the electroplating voltage can have an absolute value of less than or equal to an absolute value of a voltage at the estimated inflection point of the voltage-current function. Accordingly, an appropriate plating rate for the chemistry of the electroplating solution can be provided. In addition, the operation of estimating the voltage-current function can be followed by deplating metal plated when estimating the voltage-current function. Accordingly, any metal plated at undesirably high plating currents when estimating the voltage-current can be removed. In addition, plating at the determined electroplating voltage can begin on a clean surface so that a more accurate measure of the metal plated can be provided.

Electroplating using voltage control (constant voltage V) according to some embodiments of the invention can maintain a relatively true constant plating rate even as surface areas of the plated deposits change. Under constant voltage conditions, a change in the area of the plated deposits can produce an inverse change in the resistance R of the plating circuit:

$$R \propto 1/A;$$

and a corresponding proportional change to the current:

$$I=[V/R] \propto A.$$

Thus, the plating rate, which is proportional to I/A, can remain relatively fixed, even for complex changes to the geometry of the deposits.

An impediment to the use of voltage control may be the variation in the contact resistances of the electrodes attached to the sample surfaces, a variation which may inherently exist from sample to sample. If a common voltage is applied to all samples and all samples are plated for a fixed time, then the contact resistance variation generally may produce different plating rates in each sample and a different total volume of plated deposits on each sample. In addition, there is a risk that a plating electrode contact resistance for a given sample may change during the plating process, adding additional unknowns to the total deposited material for that sample.

Electroplating can be performed using voltage control to provide potential benefits of a relatively constant plating rate, while allowing potential drawbacks associated with voltage control to be mitigated, according to embodiments of the invention. For example, all samples can be initially plated for a short fixed time using current control (constant current). The current can be selected, based on an initial plating area, to produce a desired plating rate. During the short initial interval, the voltage drop across each sample is measured. At the end of the interval, the electroplating is switched to voltage control mode, using as the constant voltage for each sample the voltage drop measured during the initial current-controlled plating interval. In this way, contact resistances can be factored into the voltage determination for each sample and a desired plating rate can be achieved in each sample.

Other embodiments can start in voltage control mode and initially ramp the voltage for each sample until a target current is achieved. Then, each sample can be controlled at the resulting voltage for the remainder of the plating sequence.

To safeguard against changes to the contact resistance during the plating operation that may alter the total volume of plated deposits, the samples need not be plated for a fixed time interval but rather for a fixed total integrated charge. Thus, the plating operation can be ended for each sample when:

$$Q_T = \int I \, dt,$$

where $Q_T$ is the predetermined total integrated charge necessary for each sample. In practical terms, the measured integrated charge for each sample may be obtained by sampling the current at small time intervals t and by summing the I×t products.

By using voltage control with the voltage for each sample correctly adjusted for initial contact resistance and by end-pointing on total integrated charge, according to embodiments of the invention, each electroplated sample can end up with a desired volume of electroplated material and each sample is also likely to possess a reproducible composition and inclusion of organics from the plating solution.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for electroplating metal from an electroplating solution on a conductive surface wherein the electroplating solution is adjacent the conductive surface, the method comprising:
    passing an electrical current through the conductive surface and the electroplating solution adjacent the conductive surface;
    determining an electroplating voltage based on the electrical current through the conductive surface and the electroplating solution adjacent the conductive surface; and
    maintaining the determined electroplating voltage while electroplating the metal from the electroplating solution on the conductive surface.

2. A method according to claim 1 wherein maintaining the determined electroplating voltage comprises allowing an electroplating current to vary while electroplating the metal from the electroplating solution on the conductive surface.

3. A method according to claim 1 further comprising:
    integrating an electroplating current while electroplating the metal from the electroplating solution on the conductive surface to determine a total electroplating charge; and
    ceasing electroplating when the total electroplating charge reaches a predetermined threshold.

4. A method according to claim 1 wherein the conductive surface comprises a seed layer on a microelectronic substrate and an electroplating mask on the seed layer opposite the substrate wherein the electroplating mask exposes portions of the seed layer for electroplating.

5. A method according to claim 1 wherein passing an electrical current comprises generating a desired initial electroplating current through the conductive surface and the electroplating solution, and wherein determining an electroplating voltage comprises determining a electroplating voltage resulting at the desired initial electroplating current.

6. A method according to claim 5 wherein generating an initial electroplating current comprises varying an applied voltage until a desired initial electroplating current is achieved.

7. A method according to claim 5 wherein generating an initial electroplating current comprises generating an initial electroplating current calculated to provide a predetermined electroplating rate on an initial electroplating surface area.

8. A method according to claim 5 wherein generating an initial electroplating current through the conductive surface and the electroplating solution comprises generating the initial electroplating current through an anode, the electroplating solution, and the conductive surface, and wherein maintaining the determined electroplating voltage comprises maintaining the determined electroplating voltage while electroplating the metal from the electroplating solution on the conductive surface to provide a variable electroplating current through the same anode, the same electroplating solution, and the same conductive surface.

9. A method according to claim 5 wherein determining the electroplating voltage is followed by deplating metal plated when generating the initial electroplating current and wherein deplating metal plated when generating the initial electroplating current is followed by maintaining the determined electroplating voltage while electroplating the metal on the conductive surface.

10. A method according to claim 1:
    wherein passing an electrical current through the conductive surface and the electroplating solution comprises estimating a voltage-current function using currents through the conductive surface and electroplating solution, and estimating an inflection point in the voltage-current function; and
    wherein determining the electroplating voltage comprises determining the electroplating voltage based on the estimated inflection point in the voltage-current function.

11. A method according to claim 10 wherein determining the electroplating voltage comprises determining the electroplating voltage having an absolute value less than or equal to an absolute value of a voltage at the estimated inflection point of the voltage-current function.

12. A method according to claim 10 wherein determining the electroplating voltage is followed by deplating metal plated when estimating the voltage-current function and wherein deplating metal plated when generating the voltage current function is followed by maintaining the determined electroplating voltage while electroplating the metal from the electroplating solution on the conductive surface.

13. A system for electroplating metal from an electroplating solution on a conductive surface wherein the electroplating solution is adjacent the conductive surface, the system comprising:
    means for passing an electrical current through the conductive surface and the electroplating solution adjacent the conductive surface;

means for determining an electroplating voltage based on the electrical current through the conductive surface and the electroplating solution adjacent the conductive surface; and means for maintaining the determined electroplating voltage while electroplating the metal from the electroplating solution on the conductive surface.

14. A system according to claim 13 wherein the means for maintaining the determined electroplating voltage comprises means for allowing an electroplating current to vary while electroplating the metal from the electroplating solution on the conductive surface.

15. A system according to claim 13 further comprising:
means for integrating an electroplating current while electroplating the metal from the electroplating solution on the conductive surface to determine a total electroplating charge; and
means for ceasing electroplating when the total electroplating charge reaches a predetermined threshold.

16. A system according to claim 13 wherein the conductive surface comprises a seed layer on a microelectronic substrate and an electroplating mask on the seed layer opposite the substrate wherein the electroplating mask exposes portions of the seed layer for electroplating.

17. A system according to claim 13 wherein the means for passing an electrical current comprises means for generating a desired initial electroplating current through the conductive surface and the electroplating solution, and wherein the means for determining an electroplating voltage comprises means for determining an electroplating voltage resulting at the desired initial electroplating current.

18. A system according to claim 17 wherein the means for generating an initial electroplating current comprises varying an applied voltage until a desired initial electroplating current is achieved.

19. A system according to claim 17 wherein the means for generating an initial electroplating current comprises means for generating an initial electroplating current calculated to provide a predetermined electroplating rate on an initial electroplating surface area.

20. A system according to claim 17 wherein the means for generating an initial electroplating current through the conductive surface and the electroplating solution comprises means for generating the initial electroplating current through an anode, the electroplating solution, and the conductive surface, and wherein the means for maintaining the determined electroplating voltage comprises means for maintaining the determined electroplating voltage while electroplating the metal from the electroplating solution on the conductive surface to provide a variable electroplating current through the same anode, the same electroplating solution, and the same conductive surface.

21. A system according to claim 17 further comprising:
means for depleting metal plated when generating the initial electroplating current wherein depleting metal plated when generating the initial electroplating current is followed by maintaining the determined electroplating voltage while electroplating the metal on the conductive surface.

22. A system according to claim 13:
wherein the means for passing an electrical current through the conductive surface and the electroplating solution comprises means for estimating a voltage-current function using currents through the conductive surface and electroplating solution, and means for estimating an inflection point in the voltage-current function; and wherein the means for determining the electroplating voltage comprises means for determining the electroplating voltage based on the estimated inflection point in the voltage-current function.

23. A system according to claim 22 wherein the means for determining the electroplating voltage comprises determining the electroplating voltage having an absolute value less than or equal to an absolute value of a voltage at the estimated inflection point of the voltage-current function.

24. A system according to claim 22 further comprising:
means for depleting metal plated when estimating the voltage-current function wherein depleting metal plated when generating the voltage current function is followed by maintaining the determined electroplating voltage while electroplating the metal from the electroplating solution on the conductive surface.

25. A system for electroplating metal from an electroplating solution on a conductive surface wherein the electroplating solution is adjacent the conductive surface, the system comprising:
a plating controller that passes an electrical current through the conductive surface and the electroplating solution adjacent the conductive surface, that determines an electroplating voltage based on the electrical current through the conductive surface and the electroplating solution adjacent the conductive surface, and that maintains the determined electroplating voltage while electroplating the metal from the electroplating solution on the conductive surface.

26. A system according to claim 25 wherein the plating controller allows an electroplating current to vary while electroplating the metal from the electroplating solution on the conductive surface and maintaining the determined electroplating voltage.

27. A system according to claim 25 wherein the plating controller integrates an electroplating current while electroplating the metal from the electroplating solution on the conductive surface to determine a total electroplating charge, and wherein the plating controller ceases electroplating when the total electroplating charge reaches a predetermined threshold.

28. A system according to claim 25 wherein the conductive surface comprises a seed layer on a microelectronic substrate and an electroplating mask on the seed layer opposite the substrate wherein the electroplating mask exposes portions of the seed layer for electroplating.

29. A system according to claim 25 wherein the plating controller passes an electrical current by generating a desired initial electroplating current through the conductive surface and the electroplating solution, and wherein the plating controller determines an electroplating voltage by determining an electroplating voltage resulting at the desired initial electroplating current.

30. A system according to claim 29 wherein the plating controller generates an initial electroplating current by varying an applied voltage until a desired initial electroplating current is achieved.

31. A system according to claim 29 wherein the plating controller generates an initial electroplating current by generating an initial electroplating current calculated to provide a predetermined electroplating rate on an initial electroplating surface area.

32. A system according to claim 29 wherein the plating controller generates an initial electroplating current through the conductive surface and the electroplating solution by generating the initial electroplating current through an anode, the electroplating solution, and the conductive surface, and wherein the plating controller maintains the determined electroplating voltage by maintaining the determined electroplating voltage while electroplating the metal from the electroplating solution on the conductive surface to provide a variable electroplating current through the same anode, the same electroplating solution, and the same conductive surface.

33. A system according to claim 29 wherein determining the electroplating voltage is followed by deplating metal plated when generating the initial electroplating current and wherein deplating metal plated when generating the initial electroplating current is followed by maintaining the determined electroplating voltage while electroplating the metal on the conductive surface.

34. A system according to claim 25 wherein the plating controller estimates a voltage-current function using currents through the conductive surface and electroplating solution, wherein the plating controller estimates an inflection point in the voltage-current function, and wherein the plating controller determines the electroplating voltage by determining the electroplating voltage based on the estimated inflection point in the voltage-current function.

35. A system according to claim 34 wherein the plating controller determines the electroplating voltage having an absolute value less than or equal to an absolute value of a voltage at the estimated inflection point of the voltage-current function.

36. A system according to claim 34 wherein the plating controller deplates metal plated when estimating the voltage-current function, and wherein the plating controller maintains the determined electroplating voltage while electroplating the metal from the electroplating solution on the conductive surface after deplating metal plated when estimating the voltage-current function.

* * * * *

UNITED STATES PATENT AND TRADEMARK OFFICE
CERTIFICATE OF CORRECTION

PATENT NO. : 6,793,792 B2
DATED : September 21, 2004
INVENTOR(S) : Jones et al.

It is certified that error appears in the above-identified patent and that said Letters Patent is hereby corrected as shown below:

<u>Title page,</u>
Item [75], Assignee, should read -- Unitive International Limited --

Signed and Sealed this

Twenty-ninth Day of March, 2005

JON W. DUDAS
*Director of the United States Patent and Trademark Office*